United States Patent [19]
Yeh

[11] Patent Number: 6,114,233
[45] Date of Patent: Sep. 5, 2000

[54] DUAL DAMASCENE PROCESS USING LOW-DIELECTRIC CONSTANT MATERIALS

[75] Inventor: Wen-Kuan Yeh, Chu-Pei, Taiwan

[73] Assignee: United Microelectronics Corp., Hsin-Chu, Taiwan

[21] Appl. No.: 09/310,244

[22] Filed: May 12, 1999

[51] Int. Cl.[7] .............................................. H01L 21/4763
[52] U.S. Cl. ...................... 438/622; 438/623; 438/637; 438/638
[58] Field of Search ................................... 438/618, 622, 438/623, 637, 638

[56] References Cited

U.S. PATENT DOCUMENTS 5,705,430  1/1998  Avanzino et al. .
5,916,823  6/1999  Lou et al. ............................ 438/637
5,989,998  11/1999  Sugahara .............................. 438/623

*Primary Examiner*—Trung Dang
*Attorney, Agent, or Firm*—Harness, Dickey & Pierce, P.L.C.

[57] ABSTRACT

A method for forming a dual damascene structure using low-dielectric constant materials is disclosed. The method includes providing a substrate first. A first dielectric layer is formed on the substrate, and the first dielectric layer is then cured to form a stop layer. Then, a second dielectric layer is formed on the stop layer, and the second dielectric layer is cured to form an insulating layer. The insulating layer, the second dielectric layer, the stop layer, and the first dielectric layer are etched to form a via hole, and the insulating layer and the second dielectric layer is then etched to form a trench line.

22 Claims, 5 Drawing Sheets

6,114,233

DUAL DAMASCENE PROCESS USING LOW-DIELECTRIC CONSTANT MATERIALS

BACKGROUND OF THE INVENTION

1. Field of the Invention

The present invention relates to the manufacture of ultra large scale integrated (ULSI) chips in general, and in particular to an integrated method of forming interconnect layers using low dielectric constant materials.

2. Description of the Prior Art

Damascene is an interconnection fabrication process in which grooves are formed in an insulating layer and filled with metal to form the conductive lines. Dual damascene is a multi-level interconnection process in which, in addition to forming the grooves of single damascene, the conductive via openings are also formed. In the standard dual damascene process, the insulating layer is coated with a resist material which is exposed to a first mask with the image pattern of the via openings and the pattern is anisotropic etched in the upper half of the insulating layer. After removal of the patterned resist material, the insulating layer is coated with a resist material which is exposed to a second mask with the image pattern of the conductive lines in alignment with the via openings. In anisotropically etching the openings for conductive lines in the upper half of the insulating material, the vias openings already present in the upper half are simultaneously etched in the lower half of the insulating material. After the etching is complete, both the vias and grooves are filled with metal. Dual damascene is an improvement over single damascene because it permits the filling of both the conductive grooves and vias with metal at the same time, thereby eliminating process steps. The following description will explain the various steps of one conventional method for forming dual damascene structure by reference FIGS. 1.

In the manufacture of a conventional dual damascene structure, a substrate 100 has a metal layer 120 formed therein as shown in FIG. 1A. An inter-metal dielectric layer 130 and a stop layer 132 are sequentially deposited on the substrate 100. A via hole pattern 150 is transferred into the stop layer 132, as shown in FIG. 1B. Then, another inter-metal dielectric layer 134 is coated on the stop layer 132, as shown in FIG. 1C. A trench line pattern 152 is transferred into the inter-metal dielectric layer 134 while the via hole pattern 150 is transferred into the inter-metal dielectric layer 130 using stop layer 132 as a mask, as shown in FIG. 1D. Then, a metal layer 160, such as tungsten or copper, is deposited to fill the via hole and trench line, as shown in FIG. 1E. The dual damascene structure is completed by using chemical mechanical polishing method to remove excess metal layer, as shown in FIG. 1F.

For 0.18 um process and beyond, dual damascene process is a key technology to push the design rule its limits, but it is difficult to control the process window especially in via and metal trench formation. Thus, good resolution of lithography (misalignment issue) and high selectivity of via etching is the key issue for back end interconnection.

On the other hand, low-dielectric constant materials are dedicated to combine with copper integration with damascene process. Thus a method of intergrating copper with low-dielectric constant materials is a very promising topic for future back end integration.

SUMMARY OF THE INVENTION

In accordance with the present invention, a method is provided for forming a dual damascene structure that substantially enhances the via/trench alignment by using $N_2$ treatment. A thin SiONx layer can be formed due to this $N_2$ treatment, and, thus, this thin SiONx layer can act as an anti-reflection layer (ARL) for lithography.

It is another object of this invention that the thin SiON can act as etching stop layer for via/trench formation.

It is still another object of this invention that low-dielectric constant layer formed by spin-on glass process can be cured in a manner compatible with this $N_2$ treatment.

It is yet another object of this invention that this process is very compatible with sub-0.18 um technology if combined with a low-dielectric constant layer.

In one embodiment, a substrate having a conductive layer formed thereon is provided. Then, a first dielectric layer is formed on the substrate and is then cured to form a first insulating layer. Once again, a second dielectric layer is formed on the first insulating layer and then is cured to form a second insulating layer. A first photoresist layer is formed on the second dielectric layer and transfers a hole pattern to the first photoresist layer, and the second insulating layer, second dielectric layer, first insulating layer, and first dielectric layer is removed using first photoresist layer as a mask to form a via hole. A second photoresist layer on the second dielectric layer and transferring a line pattern to the second photoresist layer, and the second dielectric layer is removed using second photoresist layer as a mask to form a trench line. A conformal barrier layer is deposited and a metal layer is subsequently deposited to fill the via hole and trench line. Finally, the excess metal layer is removed to accomplish the metallization process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
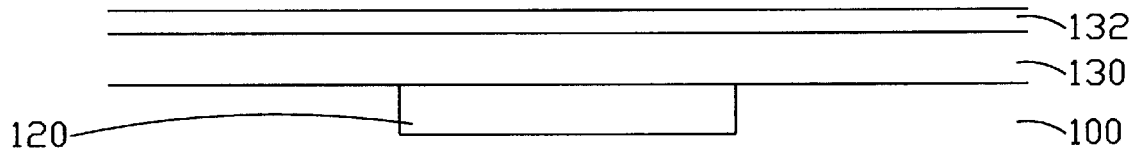
FIGS. 1A to 1F are schematic representations of structures at various stages during the formulation of a dual damascene structure using conventional, prior art techniques.
Figure 1B:
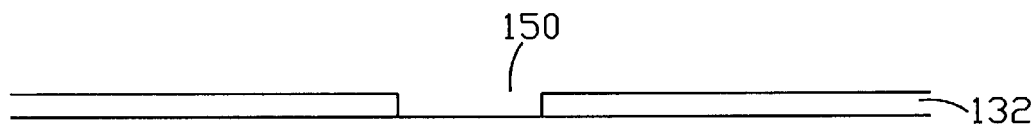
Figure 1C:
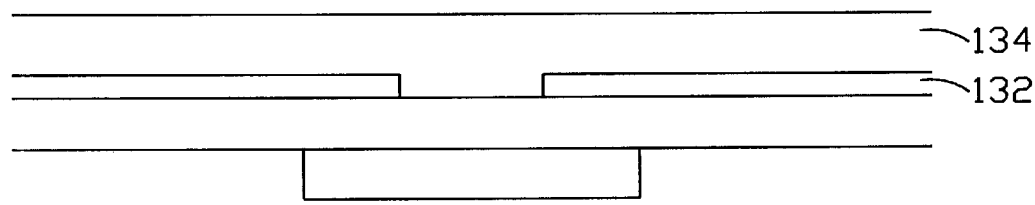
Figure 1D:
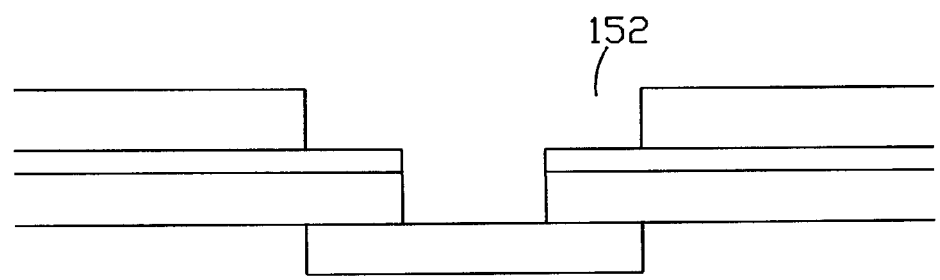
Figure 1E:
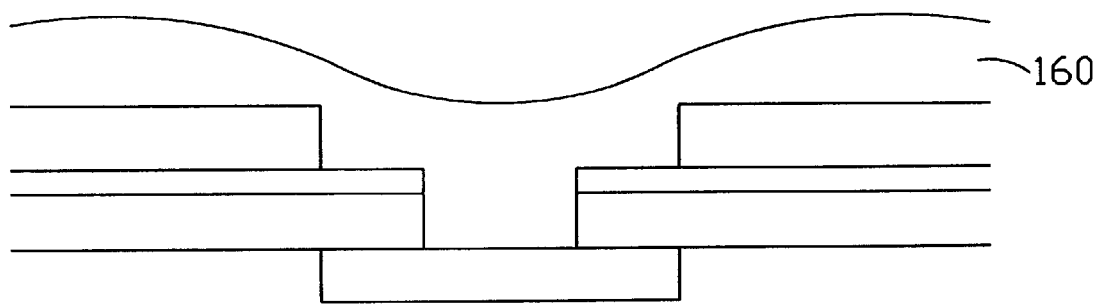
Figure 1F:
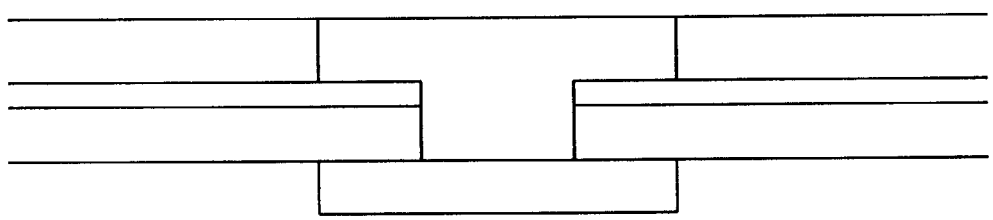
Figure 2:
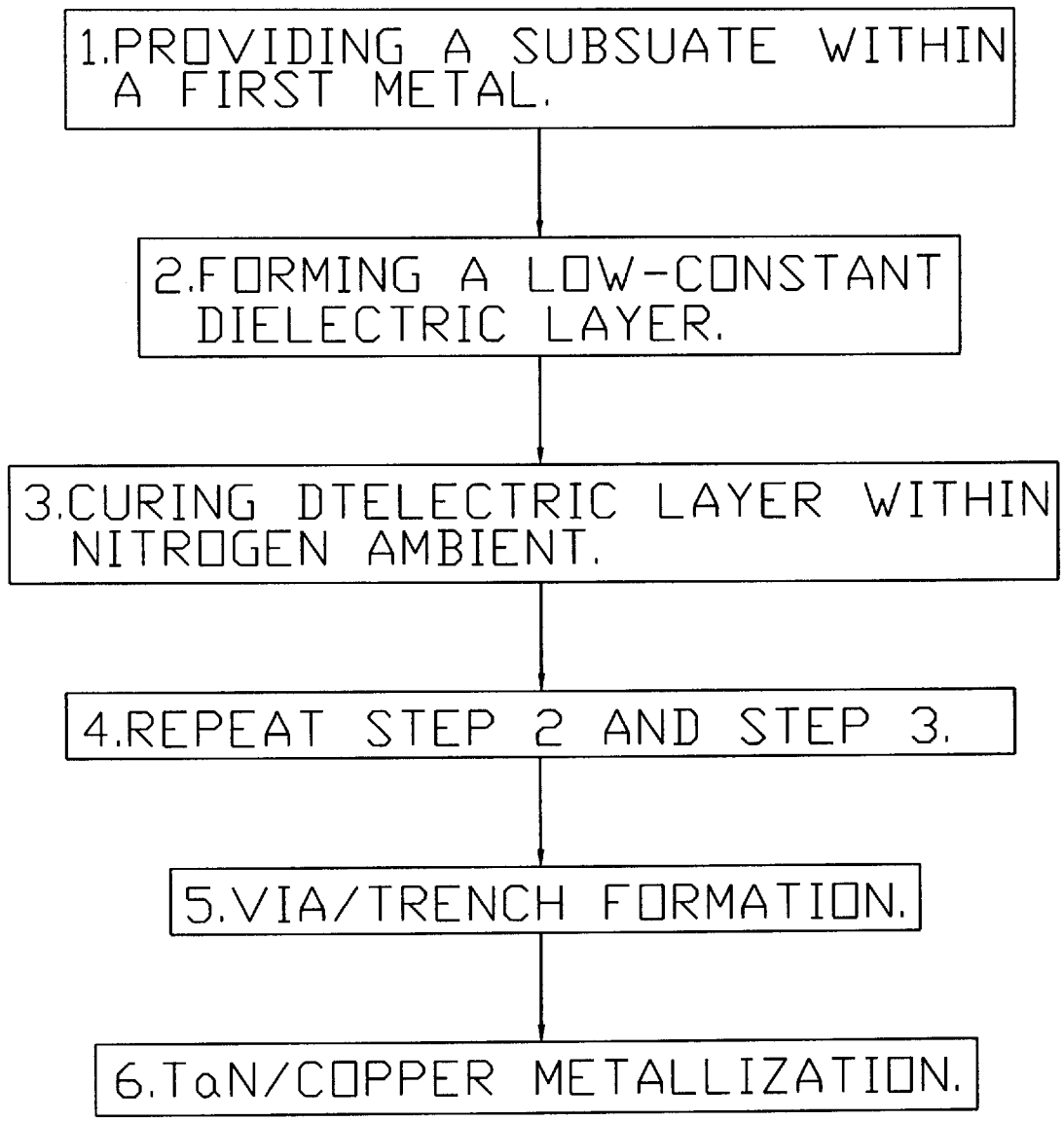
FIG. 2 is a flow diagram showing the steps for forming a dual damascene structure in accordance with a method disclosed herein.

FIG. 2 is a flow diagram summarizing the steps in one method of forming a dual damascene structure in accordance with this disclosure. First, a metal layer is formed on a substrate to be an active layer or conductive layer of the device. Next, a low-dielectric constant layer is coated on the substrate. The coated dielectric layer is then cured in nitrogen ambient. Then, another dielectric layer is coated and cured to form the upper layer. A via hole pattern and a trench line pattern are formed and then covered by a metal plug.

Suitable conditions for performing the various steps set forth in FIG. 2 are set forth below and will be explained by reference to FIGS. 3A to 3F.

Figure 3A:
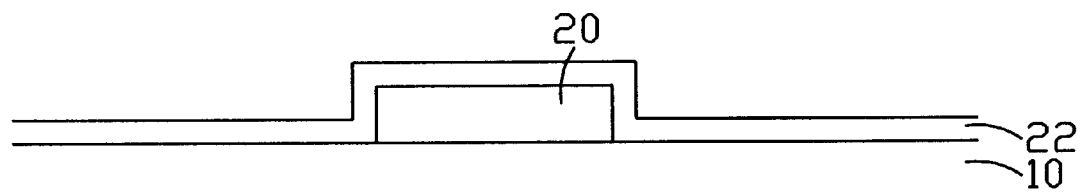
FIGS. 3A to 3F are schematic representations of structures at various stages during the formulation of a dual damascene structure in accordance with a method disclosed.

Referring to FIG. 3A, a substrate 10 useful in forming a layered semiconductor device is shown wherein a first conductive layer 20 has an insulating layer 22 formed thereon. Insulating layer 20 is silicon nitride and made by plasma enhanced chemical vapor deposition method. The thickness of this layer 20 is between about 200 to 1000 angstroms. It will briefly be noted here that substrate 10 in FIG. 3A is provided with a substructure of devices formed in the substrate and/or metal layers thereof, and as they are not significant to the invention, they are not described in detail in order not to unnecessarily obscure the present invention.

Figure 3B:
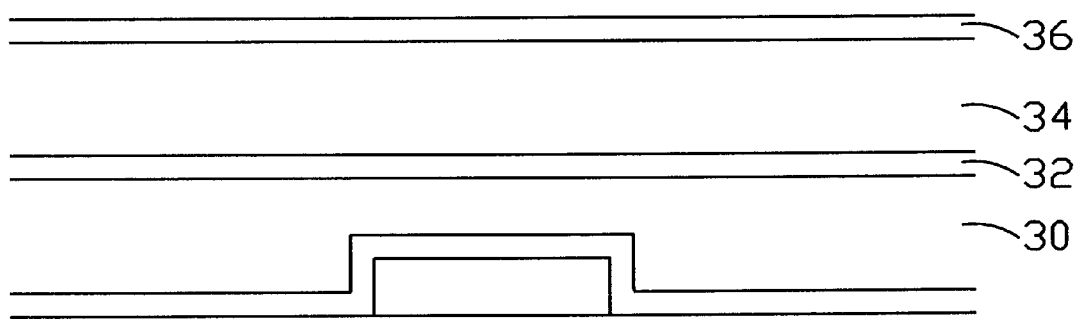

Referring to FIG. 3B, a low-dielectric layer 30 is formed by using conventional spin-on glass process. This layer 30 is an inter-metal dielectric layer and has a thickness between about 4000 to 12000 angstroms. The materials of this layer 30 can be made from any typical and well-known low-dielectric material used in wafer fabrication, but is preferably HSQ.

The substrate is then placed into a chamber and heated to a temperature of about 300 to 450° C. within nitrogen ambient, such as $N_2$ plasma or $NH_3$ treatment. The curing duration is about 600 to 3600 seconds, but preferably least than 1 minute. This treatment will generate a thin film 32 comprising silicon oxynitride and has a thickness between about 200 to 1000 angstroms.

Then, another inter-metal dielectric layer 34 is formed as layer 30 as low-dielectric layer, and this layer 34 has a thickness between about 5000 to 15000 angstroms. Once again, this substrate is cured at temperature of about 300 to 450° C. within nitrogen ambient, such as $N_2$ plasma or $NH_3$ treatment. Another silicon oxynitride layer 36 is then formed and has a thickness of between about 200 to 1000 angstroms.

Figure 3C:
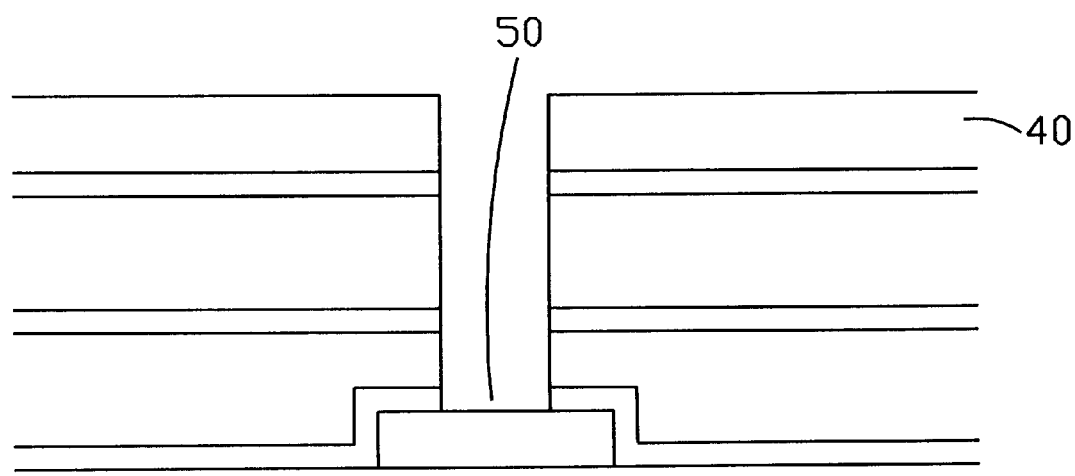

Referring to FIG. 3C, a photoresist layer 40 is formed on the layer 36 and patterned via a hole pattern. Then, a prior anisotropically etching is performed to remove a portion of silicon oxynitride layer 36, inter-metal dielectric layer 34, silicon oxynitride layer 32, inter-metal dielectric layer 30, and silicon nitride layer 22, to contact the metal 20 using photoresist layer 40 as a mask.

Figure 3D:
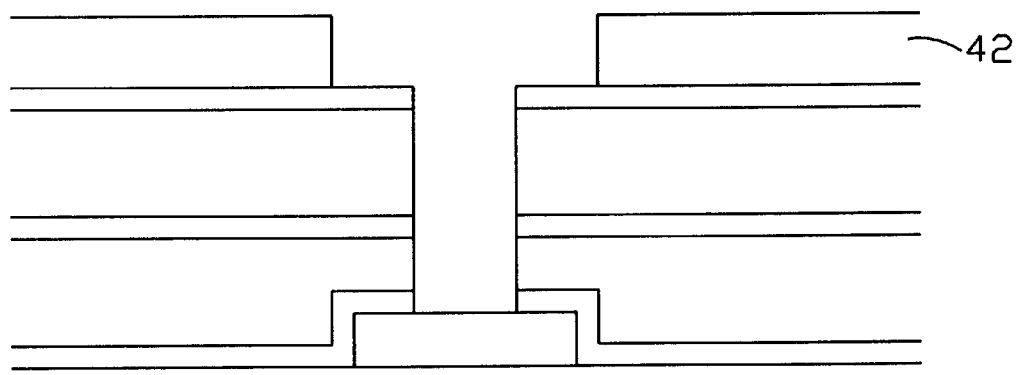
Figure 3E:
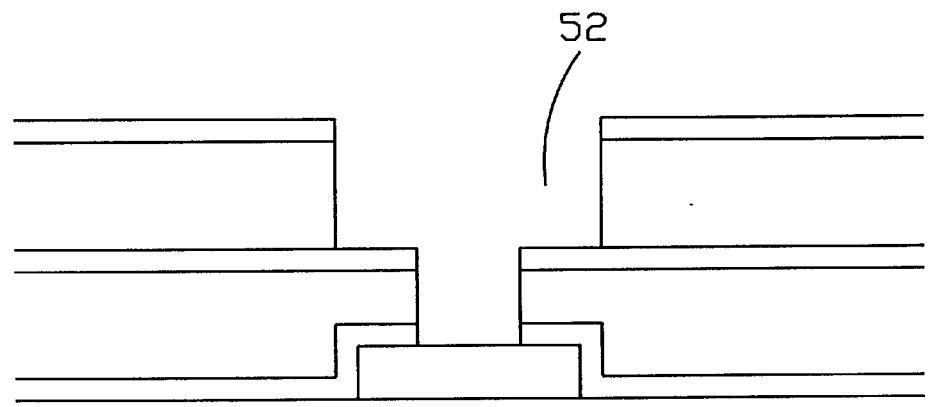

This photoresist layer 40 will be removed and another patterned photoresist layer 42 is placed, as shown in FIG. 3D. This patterned photoresist layer 42 has a trench line pattern. Then, a trench line 52 is formed by a prior anisotropically etching silicon oxynitride layer 36 and inter-metal dielectric layer 34 using photoresist layer 42 as a mask. The photoresist layer 42 is then removed, as shown in FIG. 3E.

Figure 3F:
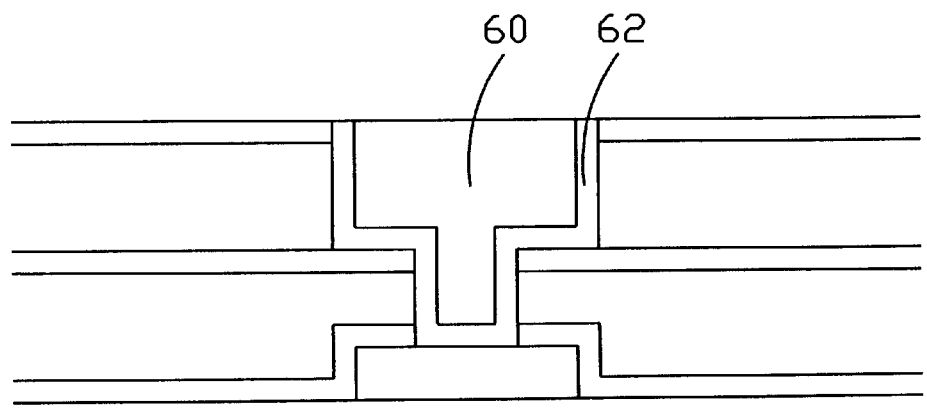

Referring to FIG. 3F, a conformal tantalum nitride 62 is deposited as a barrier layer by using any conventional method and has a thickness between about 100 to 500 angstroms. A copper layer 60 is subsequently deposited to fill the via hole and trench line. The excess metal is removed by chemical mechanical polishing method to accomplish the metallization process.

Although specific embodiments have been illustrated and described, it will be obvious to those skilled in the art that various modifications may be made without departing from what is intended to be limited solely by the appended claims.

What is claimed is:

1. A method for forming a dual damascene structure, said method comprising:

providing a substrate;

forming a first dielectric layer on said substrate;

curing said first dielectric layer to form a stop layer;

forming a second dielectric layer on said stop layer;

curing said second dielectric layer to form an insulating layer;

etching said insulating layer, said second dielectric layer, said stop layer, and said first dielectric layer to form a via hole; and etching said insulating layer and said second dielectric layer to form a trench line.

2. The method according to claim 1, wherein said substrate comprises a conductive layer and a passivation layer formed on said conductive layer.

3. The method according to claim 2, wherein said passivation layer comprises silicon nitride.

4. The method according to claim 1, wherein both said first dielectric layer and second dielectric layer are low-dielectric constant materials.

5. The method according to claim 1, wherein both said first dielectric layer and second dielectric layer are formed by spin-on glass process.

6. The method according to claim 1, wherein said steps of curing said first dielectric layer is performed at a temperature between about 300 to 450° C. with $N_2$.

7. The method according to claim 1, wherein said steps of curing said first dielectric layer is performed at a temperature between about 300 to 450° C. with $NH_3$.

8. The method according to claim 1, wherein said stop layer comprises silicon oxynitride and has a thickness between about 300 to 450 angstroms.

9. The method according to claim 1, wherein said steps of curing said second dielectric layer is performed at a temperature between about 300 to 450° C. with $N_2$.

10. The method according to claim 1, wherein said steps of curing said second dielectric layer is performed at a temperature between about 300 to 450° C. with $NH_3$.

11. The method according to claim 1, wherein said insulating layer comprises silicon oxynitride having a thickness between about 200 to 1000 angstroms.

12. A method for forming a dual damascene structure, said method comprising:

providing a substrate having a conductive layer formed thereon;

forming a first dielectric layer on said substrate;

curing said first dielectric layer to form a first insulating layer;

forming a second dielectric layer on said first insulating layer;

curing said second dielectric layer to form a second insulating layer;

forming a first photoresist layer on said second dielectric layer and transferring a hole pattern to said first photoresist layer;

removing said second insulating layer, second dielectric layer, first insulating layer, and first dielectric layer to form a via hole;

forming a second photoresist layer on said second dielectric layer and transferring a line pattern to said second photoresist layer;

removing said second dielectric layer to form a trench line;

depositing a conformal barrier layer;

depositing a metal layer to fill said via hole and trench line; and removing said excess metal layer.

13. The method according to claim 12, wherein said conductive layer comprises a passivation layer formed on said conductive layer.

14. The method according to claim 13, wherein said passivation layer comprises silicon nitride.

15. The method according to claim 12, wherein both said first dielectric layer and second dielectric layer are low-dielectric constant materials.

16. The method according to claim 12, wherein both said first dielectric layer and second dielectric layer are formed by spin-on glass process.

17. The method according to claim 12, wherein said steps of curing said first dielectric layer is performed at a temperature between about 300 to 450° C. with $N_2$.

18. The method according to claim 12, wherein said steps of curing said first dielectric layer is performed at a temperature between about 300 to 450° C. with $NH_3$.

19. The method according to claim 12, wherein said stop layer comprises silicon oxynitride and has a thickness between about 200 to 1000 angstroms.

20. The method according to claim 12, wherein said steps of curing said second dielectric layer is performed at a temperature between about 300 to 450° C. with $N_2$.

21. The method according to claim 12, wherein said steps of curing said second dielectric layer is performed at a temperature between about 300 to 450° C. with $NH_3$.

22. The method according to claim 12, wherein said insulating layer comprises silicon oxynitride having a thickness between about 200 to 1000 angstroms.

* * * * *